(12) United States Patent
Xiang et al.

(10) Patent No.: US 11,444,095 B2
(45) Date of Patent: Sep. 13, 2022

(54) SEMICONDUCTOR DEVICE WITH INTEGRATED MEMORY DEVICES AND MOS DEVICES AND PROCESS OF MAKING THE SAME

(71) Applicant: UNITED MICROELECTRONICS CORP., Hsin-Chu (TW)

(72) Inventors: Wang Xiang, Singapore (SG); Chia-Ching Hsu, Singapore (SG); Shen-De Wang, Hsinchu County (TW); Weichang Liu, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 37 days.

(21) Appl. No.: 17/229,848

(22) Filed: Apr. 13, 2021

(65) Prior Publication Data
US 2021/0233924 A1    Jul. 29, 2021

Related U.S. Application Data

(62) Division of application No. 16/724,365, filed on Dec. 22, 2019, now Pat. No. 11,011,535.

(51) Int. Cl.
*H01L 29/76* (2006.01)
*H01L 29/66* (2006.01)
(Continued)

(52) U.S. Cl.
CPC .... *H01L 27/11568* (2013.01); *H01L 21/0217* (2013.01); *H01L 21/0274* (2013.01);
(Continued)

(58) Field of Classification Search
CPC ......... H01L 27/11568; H01L 21/02164; H01L 21/0217; H01L 21/02238; H01L 21/0274; H01L 21/28035; H01L 21/28167; H01L 21/31144; H01L 21/32139; H01L 21/823828; H01L 21/823857; H01L 27/092; H01L 27/11573; H01L 29/40117;
(Continued)

(56) References Cited

U.S. PATENT DOCUMENTS 6,750,525 B2    6/2004   Yim
7,250,654 B2    7/2007   Chen
(Continued)

*Primary Examiner* — David Vu
(74) *Attorney, Agent, or Firm* — Winston Hsu

(57) ABSTRACT

A semiconductor device with integrated memory devices and metal-oxide-semiconductor (MOS) devices, including a substrate with a first area and a second area, multiple double-diffused metal-oxide-semiconductor (DMOS) devices on the first area, wherein the double-diffused metal-oxide-semiconductor (DMOS) device includes a field oxide on the substrate, a first gate dielectric layer adjacent to the field oxide, and a first polysilicon gate on the field oxide and the first gate dielectric layer, and multiple memory units on the second area, wherein the memory unit includes an oxide-nitride-oxide (ONO) tri-layer and a second polysilicon gate on the oxide-nitride-oxide (ONO) tri-layer, wherein a top surface of the second polysilicon gate of the memory unit in the second area and a top surface of the first polysilicon gate of the double-diffused metal-oxide-semiconductor (DMOS) in the first area are on the same level.

5 Claims, 4 Drawing Sheets

(51) Int. Cl.

| | |
|---|---|
| *H01L 27/092* | (2006.01) |
| *H01L 27/11568* | (2017.01) |
| *H01L 27/11573* | (2017.01) |
| *H01L 21/02* | (2006.01) |
| *H01L 21/28* | (2006.01) |
| *H01L 29/49* | (2006.01) |
| *H01L 21/3213* | (2006.01) |
| *H01L 21/027* | (2006.01) |
| *H01L 29/78* | (2006.01) |
| *H01L 29/51* | (2006.01) |
| *H01L 21/8238* | (2006.01) |
| *H01L 21/311* | (2006.01) |

(52) U.S. Cl.
CPC .. *H01L 21/02164* (2013.01); *H01L 21/02238* (2013.01); *H01L 21/28035* (2013.01); *H01L 21/28167* (2013.01); *H01L 21/31144* (2013.01); *H01L 21/32139* (2013.01); *H01L 21/823828* (2013.01); *H01L 21/823857* (2013.01); *H01L 27/092* (2013.01); *H01L 27/11573* (2013.01); *H01L 29/40117* (2019.08); *H01L 29/4916* (2013.01); *H01L 29/513* (2013.01); *H01L 29/518* (2013.01); *H01L 29/66681* (2013.01); *H01L 29/7816* (2013.01)

(58) Field of Classification Search
CPC . H01L 29/4916; H01L 29/513; H01L 29/518; H01L 29/66681; H01L 29/7816; H01L 29/42368; H01L 29/7835; H01L 21/823462; H01L 27/088; H01L 27/0922
See application file for complete search history.

(56) References Cited

U.S. PATENT DOCUMENTS

| | | |
|---|---|---|
| 9,362,125 B2 | 6/2016 | Chang |
| 2005/0118759 A1 | 6/2005 | Noda |
| 2007/0048936 A1 | 3/2007 | Kim |
| 2007/0102754 A1* | 5/2007 | Chen ................ H01L 27/11573 257/E21.679 |

\* cited by examiner

SEMICONDUCTOR DEVICE WITH INTEGRATED MEMORY DEVICES AND MOS DEVICES AND PROCESS OF MAKING THE SAME

CROSS REFERENCE TO RELATED APPLICATIONS

This application is a divisional of application Ser. No. 16/724,365, filed on Dec. 22, 2019 and entitled "SEMICONDUCTOR DEVICE WITH INTEGRATED MEMORY DEVICES AND MOS DEVICES AND PROCESS OF MAKING THE SAME", which is incorporated herein by reference.

BACKGROUND OF THE INVENTION

1. Field of the Invention

The present invention generally relates to a semiconductor device and a process of making the same, and more specifically, to a semiconductor device with integrated memory devices and MOS devices and a process of making the same.

2. Description of the Prior Art

SONOS (silicon-oxide-nitride-oxide-silicon) is a cross sectional structure of MOSFET often used for non-volatile memories, such as EEPROM and flash memories. It is one of CTF (charge trap flash) variants, which is distinguished from traditional non-volatile memory structures by the use of silicon nitride instead of a polysilicon-based floating gate for the charge storage material. SONOS is advantageous in its simple structure and process in comparison to the ones of complex floating gate, which may need a stacked gate structure and cause a severe step difference between a cell array region and a peripheral circuit region.

On the other hand, BCD (BIPOLAR-CMOS-DMOS) is a key technology for power ICs. BCD is a family of silicon processes, each of which combines the strengths of three different process technologies onto a single chip: Bipolar for precise analog functions, CMOS (Complementary Metal Oxide Semiconductor) for digital design and DMOS (Double Diffused Metal Oxide Semiconductor) for power and high-voltage elements. This combination of technologies brings many advantages: improved reliability, reduced electromagnetic interference and smaller chip area. BCD has been widely adopted and continuously improved to address a broad range of products and applications in the fields of power management, analog data acquisition and power actuators.

The integration of non-volatile memory devices and power ICs such as aforementioned SONOS-based flash and BCD structure in the same chip is always a subject of research and development for those skilled in the art in semiconductor field. SOC (System-On-Chip), by which system functions conventionally achieved by a combination of IC such as graphical processing unit (GPU), a central processing unit (CPU), power IC, and system memory (RAM) in multiple numbers are realized in one IC chip. Like a flash memory needs a charge-trapping layer under the gate, other IC devices may need additional and individual processes to form their distinguishing components such as gate dielectric layers with different thickness and various wells, source/drain areas and device insulation structures. Accordingly, industry insiders still need to develop new approaches for improving the process integration of memory devices and IC devices.

SUMMARY OF THE INVENTION

The present invention hereby provides a novel structure and relevant process for integrating memory devices and IC devices, especially suitable to the integration of SONOS-based flash and DMOS of the BCD (BIPOLAR-CMOS-DMOS) structure.

One aspect of present invention is to provide a method of integrating memory and metal-oxide-semiconductor (MOS) processes, including providing a substrate with a first area and a second area, forming an oxide layer on said substrate and a nitride layer on the oxide layer in the first area and the second area, forming a field oxide in the first area by an oxidation process with the nitride layer as a mask, wherein the oxidation process simultaneously forms a top oxide layer on the nitride layer, removing the top oxide layer, the nitride layer and the oxide layer in the first area, forming a gate dielectric layer on the substrate in the first area after the top oxide layer, the nitride layer and the oxide layer are removed, forming a polysilicon layer on the substrate after the gate dielectric layer is formed, and patterning the polysilicon layer into MOS units in the first area and memory units in the second area.

Another aspect of present invention is to provide a semiconductor device with integrated memory devices and metal-oxide-semiconductor (MOS) devices, including a substrate with a first area and a second area, multiple double-diffused metal-oxide-semiconductor (DMOS) devices on the first area, wherein the double-diffused metal-oxide-semiconductor (DMOS) device includes a field oxide on said substrate, a first gate dielectric layer adjacent to the field oxide, and a first polysilicon gate on the field oxide and the first gate dielectric layer, and multiple memory units on the second area, wherein the memory unit comprises an oxide-nitride-oxide (ONO) tri-layer and a second polysilicon gate on the oxide-nitride-oxide (ONO) tri-layer, wherein a top surface of the second polysilicon gate of the memory unit in the second area and a top surface of the first polysilicon gate of the double-diffused-metal-oxide-semiconductor (DMOS) in the first area are on the same level.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
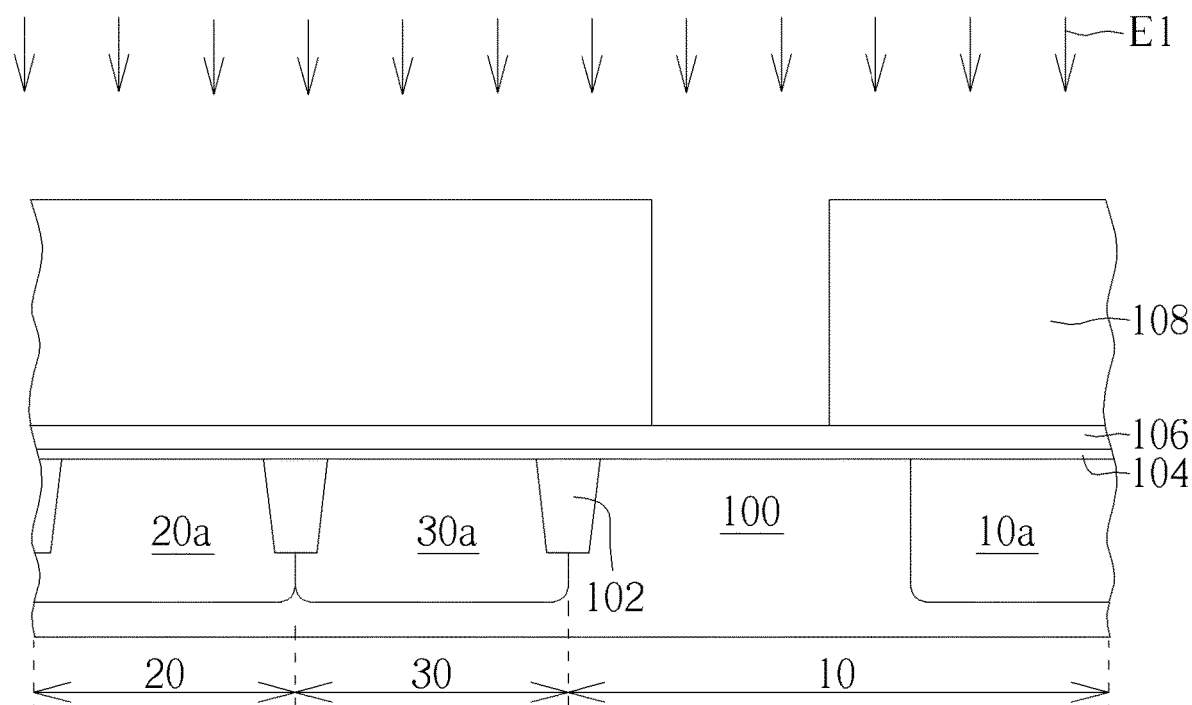
FIGS. 1-8 are schematic cross-sectional views illustrating the process flow in accordance with the preferred embodiment of the present invention.

It should be noted that all the figures are diagrammatic. Relative dimensions and proportions of parts of the drawings have been shown exaggerated or reduced in size, for the sake of clarity and convenience in the drawings. The same

DETAILED DESCRIPTION

In the following detailed description of the present invention, reference is made to the accompanying drawings which form a part hereof and is shown by way of illustration and specific embodiments in which the invention may be practiced. These embodiments are described in sufficient details to enable those skilled in the art to practice the invention. Other embodiments may be utilized and structural, logical, and electrical changes may be made without departing from the scope of the present invention. The following detailed description, therefore, is not to be taken in a limiting sense, and the scope of the present invention is defined by the appended claims.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something). Further, spatially relative terms, such as "beneath," "below," "lower," "above," "upper," and the like, may be used herein for ease of description to describe one element or feature's relationship to another element(s) or feature(s) as illustrated in the figures.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or through holes are formed) and one or more dielectric layers.

FIGS. 1-8 are schematic cross-sectional views illustrating the process flow of integrating memory and metal-oxide-semiconductor (MOS) processes in accordance with the preferred embodiment of the present invention. These figures will be explained sequentially in following embodiments. The same element in repeated occurrences is given the same reference number each time. Also it is preferred that if possible the same element in different embodiments of the invention is given the same reference number to mitigate any discrepancies.

This invention will be further explained with the following embodiment and the accompanying drawings, which are not intended to restrict the scope of this invention. For example, although the memory area in the present invention is for forming SONOS memory cells in the following embodiment, it may alternatively be for forming memory cells of another type, such as SONONOS memory cells, SNNNS memory cells or MONOS memory cells. Moreover, although the MOS device area is defined mainly as a high-voltage (HV) device area in the following embodiment, there may alternatively be a different combination of device areas requiring different gate oxide thicknesses, such as device areas for low-voltage (LV) device or mid-voltage (MV) device. Furthermore, although only one or two devices or units are exemplified in each defined device area, it should be noted that, in real implementation, each device area is provided with multiple devices. For example, memory area is provided with multiple memory units or cells in array arrangement, and MOS area may be provided currently with complementary p-type MOS and n-type MOS, and for the simplicity and clarity of present invention and not obscuring the key point of present invention, only a part of DMOS of bipolar-CMOS-DMOS (BCD) is shown in the figures.

Please refer to FIG. 1. A semiconductor substrate 100, such as a lightly doped p-type silicon-based substrate, is provided with pre-determined device areas, such as a high-voltage (HV) device area (referred hereinafter as first area) 10, a memory area (referred hereinafter as second area) 20 and a low-voltage (LV) device area (referred hereinafter as third area) 30. The substrate 100 may be a bulk silicon substrate or a silicon layer of OI (silicon-on-insulator) substrate. Isolation structures 102, such as shallow trench isolations (STI), are then formed in the substrate 100 to isolate active areas for individual devices. The HV devices to be formed in the first area 10 may include peripheral input/output (IO) devices or power ICs like bipolar-CMOS-DMOS (BCD). The memory device to be formed in the second area 20 may include SONOS-based non-volatile memory (NVM). The LV devices to be formed in the third area 30 may include CMOS logic/analog devices. Wells 10a, 20a, 30a, such as n-type wells required respectively by the HV devices, memory devices and LV devices to be formed on the first area 10, second area 20 and third area 30 are formed in the substrate 100 by ion implantation with n-type impurity such like phosphorous, arsenic or the like into the p-type substrate 100 and diffusion in high-temperature heat treatment. Although there is only one well formed in each defined region for the simplicity of drawings, please note that there might be other wells or different well profiles formed in the substrate in real implementation, such as deep well or pocket well.

Refer again to FIG. 1. After the isolation structures 102 and wells are formed in the substrate 100, a silicon oxide layer 104 and a silicon nitride layer 106 are formed sequentially on the substrate 100. In the embodiment of present invention, the silicon oxide layer 104 and the silicon nitride layer 106 will be the bottom oxide layer and middle nitride layer of ONO charge-trapping tri-layer for the memory devices on the second region 20. The silicon oxide layer 104 may be formed through in-situ steam generation (ISSG) oxidation of a surface layer of the substrate 100. The ISSG oxidation may be conducted at a temperature in the range of 900° C. to 1000° C. C., preferably at about 950° C. The silicon oxide layer 104 may have a thickness in the range of 40 Å to 60 Å, preferably about 50 Å. The silicon nitride layer 106 may be formed through furnace deposition, and may have a thickness in the range of 75 Å to 95 Å, preferably about 85 Å. After the silicon oxide layer 104 and the silicon nitride layer 106 are formed, a patterned photoresist 108 is formed on the silicon nitride layer 106, which exposes a predetermined region to be formed with field oxide for the DMOS device on the first region in later process.

Figure 2:
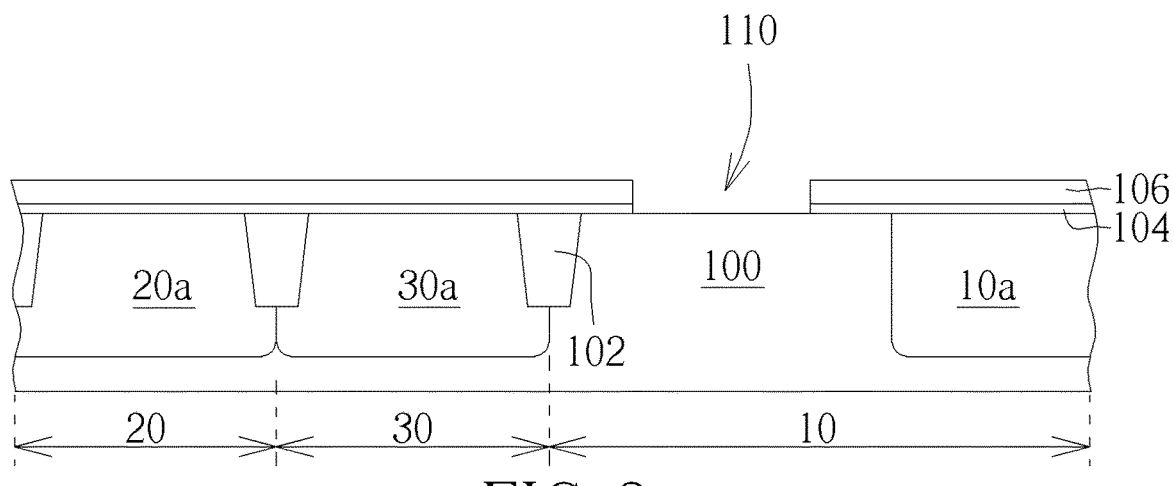

Refer still to FIG. 1. After the photoresist 108 is formed, a first etch process E1 is performed to remove the exposed silicon nitride layer 106 and silicon oxide layer 104 on the first area 10. The first etch process E1 may be a dry etching, or a combination of dry etching and wet etching. In the embodiment of present invention, the silicon nitride 106 not only functions as a charge trapping layer for final memory devices, it also serves as an etch mask in this first etch process E1. As shown in FIG. 2, the first etch process E1 removes the exposed silicon nitride layer 106 and silicon oxide layer 104 and forms an opening 110 on the substrate 100, which is a predetermined position for forming field oxide on the first area 10 in later process. After the opening 110 is formed, the photoresist 108 may be removed by an ashing process.

Figure 3:
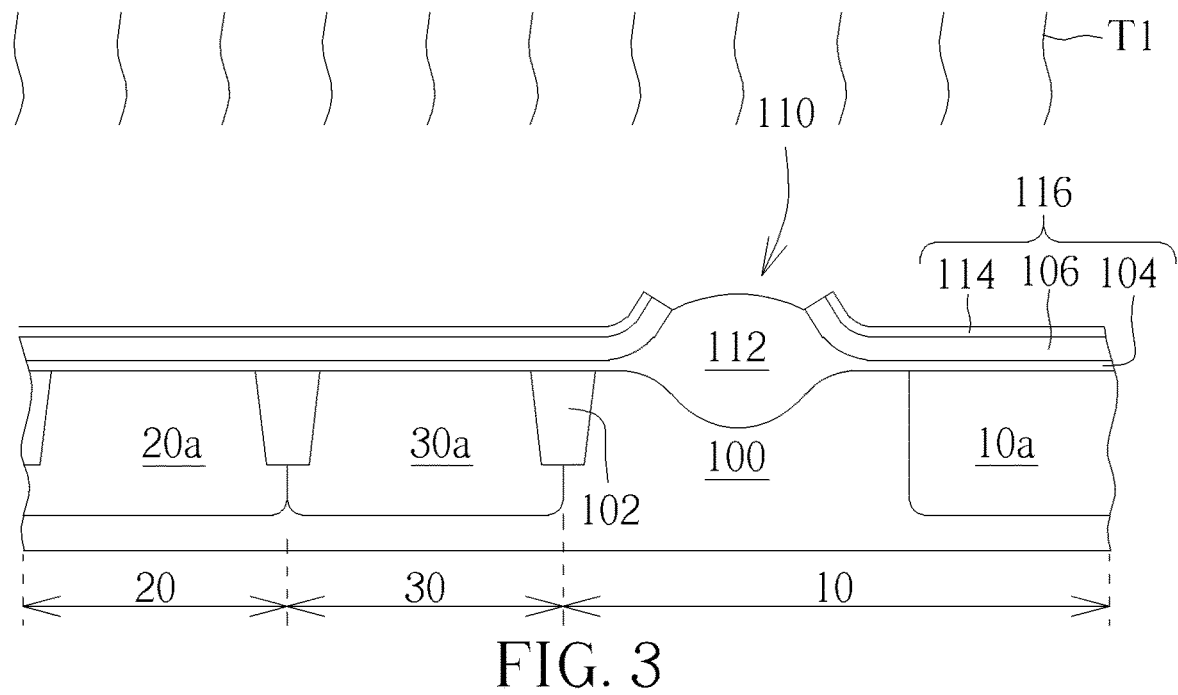

Next, please refer to FIG. 3. After the photoresist 108 is removed and the opening 110 is formed, a local oxidation of silicon (LOCOS) process T1 is performed to form a field oxide 112 selectively in the opening 110 on the substrate 100. The nitride layer 106 and the oxide layer 104 on the substrate 100 prevent the diffusion of oxygen into the substrate 100 at high temperature about 800° C. to 1200° C. The oxygen penetrates in depth of the exposed substrate 100, reacts with silicon and transforms it into silicon oxide. In this way, an immersed structure is formed, and since the field oxide 112 bulges from the substrate 100, the surrounding silicon nitride layer 106 is also perked up from the substrate 100, thereby forming a bird's beak feature. The field oxide 112 formed in this process will be a part of double-diffused MOS (DMOS) structure formed in later process.

More importantly, refer still to FIG. 3. Please note that in the embodiment of present invention, the LOCOS process T1 would also form a top silicon oxide layer 114 from the silicon nitride layer 106. The top oxide layer 114 is formed conformally on the silicon nitride layer 106 and constitutes an ONO charge-trapping tri-layer 116 together with the silicon nitride layer 106 and the silicon oxide layer 104. The LOCOS process T1 in the present invention may be control to form the top silicon oxide layer 114 and the field oxide 112 with desired thicknesses simultaneously and respectively from the silicon nitride layer 104 and the substrate 100. For example, the thickness of top silicon oxide layer 116 may be in the range of 65 Å to 85 Å, preferably about 75 Å, and the maximum thickness of field oxide 112 may be about 3000 Å.

Figure 4:
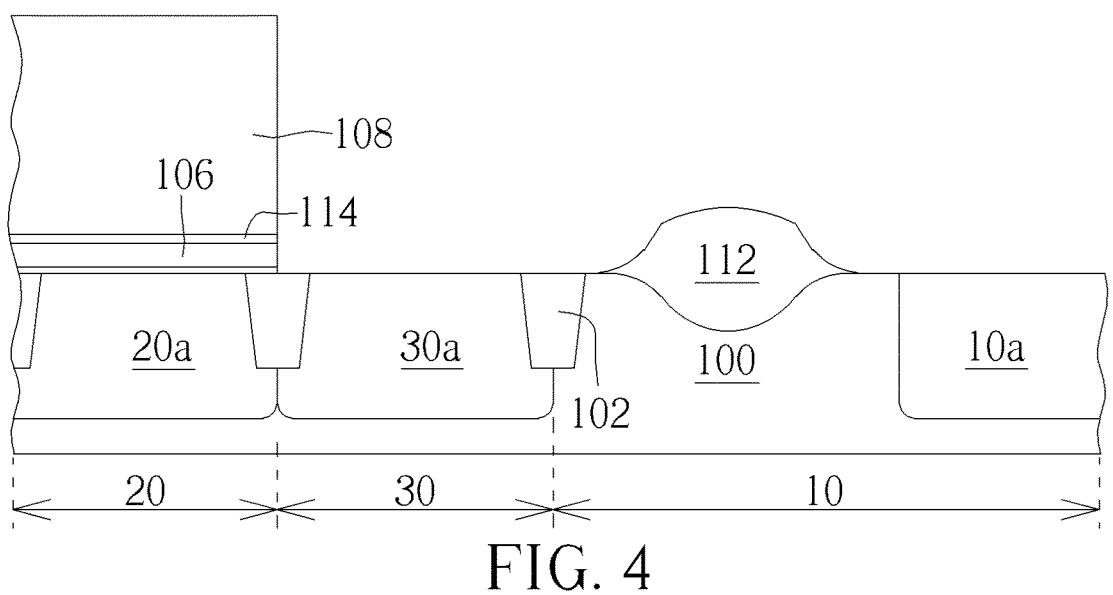

Next, please refer to FIG. 4. After the field oxide 112 is formed, a patterned photoresist 118 is formed on the ONO charge-trapping tri-layer 116 in the second area 20 and exposing the ONO charge-trapping tri-layer 116 on the first area 10 and the third area 30. After the photoresist 118 is formed, a second etch process E2 is then performed to remove the exposed ONO charge-trapping tri-layer 116 on the first area 10 and the third area 30, so that the ONO charge-trapping tri-layer 116 would only remain on the second area 20, i.e. the memory area. The second etch process E2 may be wet etching, dry etching, or a combination of wet etching and dry etching. In the embodiment of present invention, the tri-layer 116 will serve as a charge trapping layer for final memory devices like SONOS-based flash. The device on the HV and LV area, on the other hand, do not need ONO charge-trapping tri-layer 116.

Figure 5:
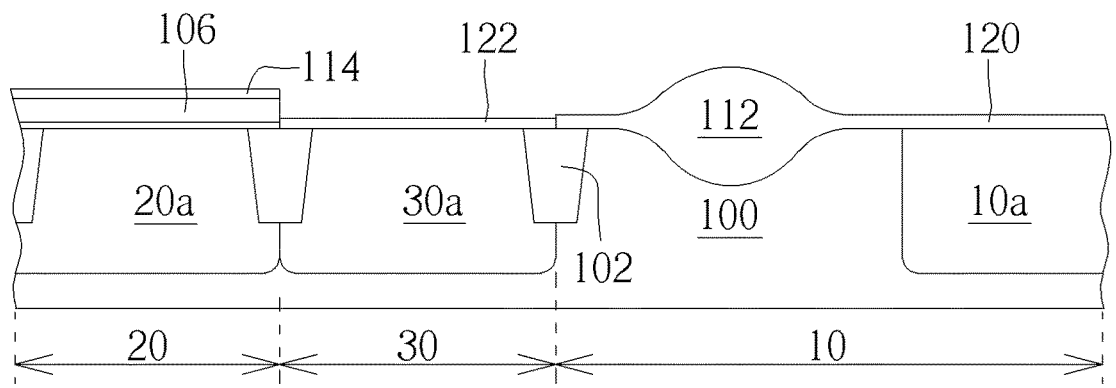

Next, please refer to FIG. 5. After the unnecessary ONO tri-layer 116 is removed from the first area 10 and the third area 30, gate dielectric layers 120, 122 are then formed respectively on the first area 10 and the third area 30. Please note that, in the embodiment of present invention, since the first area 10 and the third area 30 are defined respectively as a HV device area and a LV device area. The thickness of gate dielectric layers 120 on the first area 10 would be thicker than the thickness of gate dielectric layers 122 on the third area 30. The gate dielectric layers 120, 122 may be formed, for example, by individual processes with additional masks, to form the films with thicknesses respectively from 16 to 18 nm and from 20Å to 40 Å. The process for forming the thick gate dielectric layer 120 on the first region 10 may be a dry oxidation method or a wet oxidation method. The dry oxidation method may include thermal oxidation. The wet oxidation method may include ISSG oxidation. The temperature set in the wet oxidation method may range from 800° C. to 900° C., preferably at about 850° C. The process for forming the thin gate dielectric layer 122 on the third region 30 may be ISSG oxidation and subsequent decoupled plasma nitridation (DPN). In this process, the second area 20 covered constantly by the photoresist 118 is not formed with thermal dielectric film. After the gate dielectric layers 120, 122 are formed, the photoresist 118 is removed by an ashing process, Next, please refer to FIG. 6. After the gate dielectric layers 120, 122 are formed and the photoresist 118 is removed, a conductive layer 124 is formed over the whole surface of the first area 10, the second area 20 and the third area 30. For the conductive layer 124, for example, a polysilicon layer or a metal polycide layer may be used. If a polysilicon is used as a material for the conductive layer 124, a resistance value of the conductive layer 124 can be reduced by an ion implantation of an impurity into the conductive layer 124. A planarization process such as CMP may be performed to level the top surface of conductive layer 124.

Figure 6:
Figure 6:
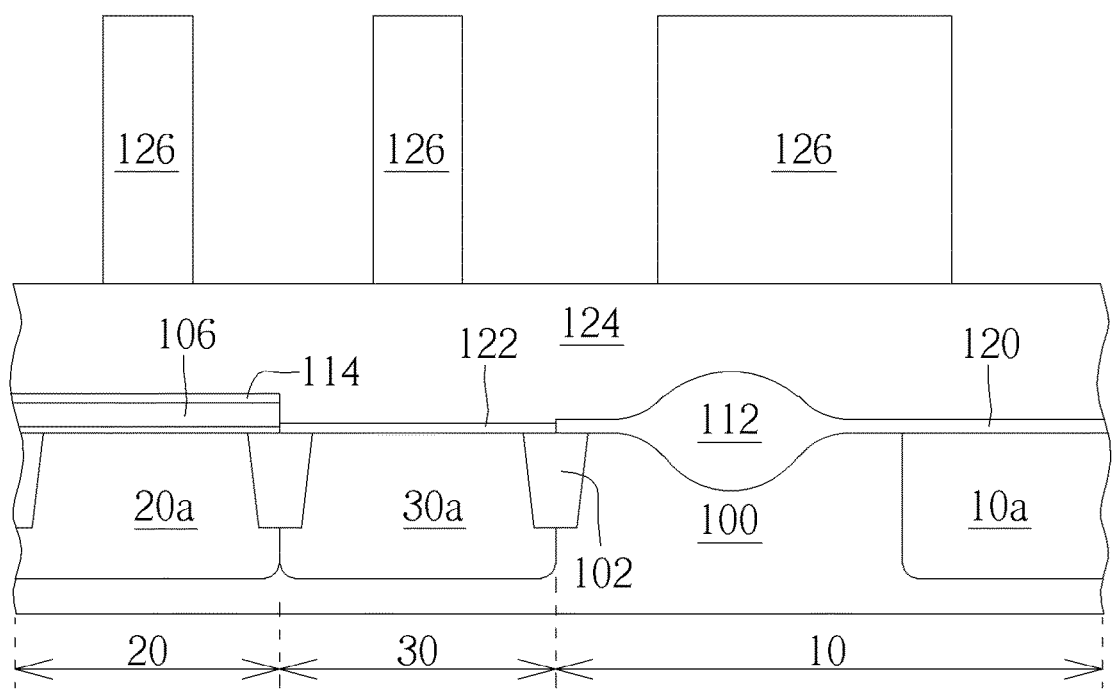
Figure 7:
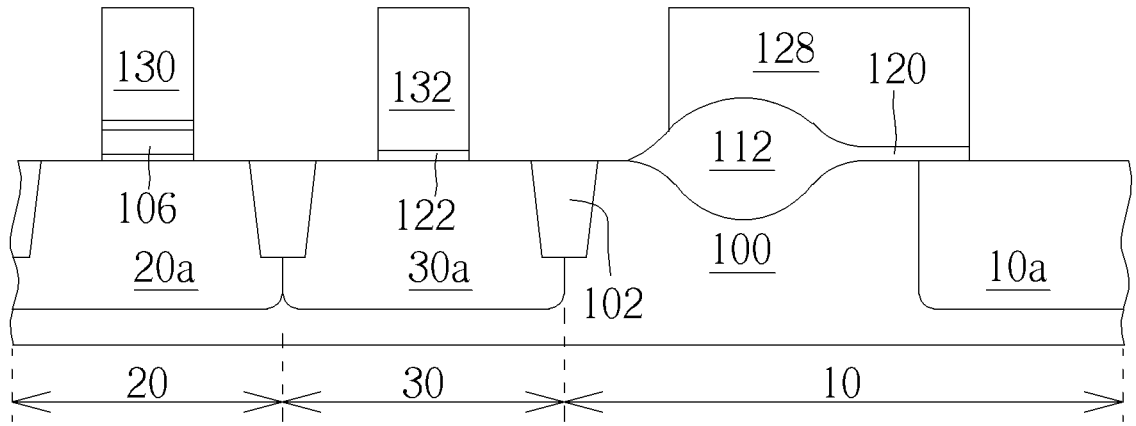

Refer still to FIG. 6, after the conductive layer 124 is formed, a pattern photoresist 126 is formed on the conductive layer 124. The pattern photoresist 126 defines the pattern of gate structures to be formed on each area, including word lines or select gates on the memory area and gates of DMOS and CMOS respective on the HV area and the LV area. After the photoresist 126 is formed, an etch process E3 is then performed to etch and pattern the conductive layer 124. The third etch process E3 may a dry etching, or a combination of dry etching and wet etching. The gate electrode 128, 130 and 132 of device in each area is therefore formed as shown in FIG. 7. The gate dielectric layers 120, 122 and the ONO charge-trapping tri-layer 116 respectively below gate electrodes 128, 130 and 132 are also patterned in this process. It can be seen from the figure that the gate electrode 128 of DMOS device in the first area 10 crosses over the field oxide 112 from one side. The field oxide structure may provide DMOS device better device isolation and endurance for electrostatic discharge. After the gate patterns are formed, the photoresist 126 is removed by an ashing process.

Figure 8:
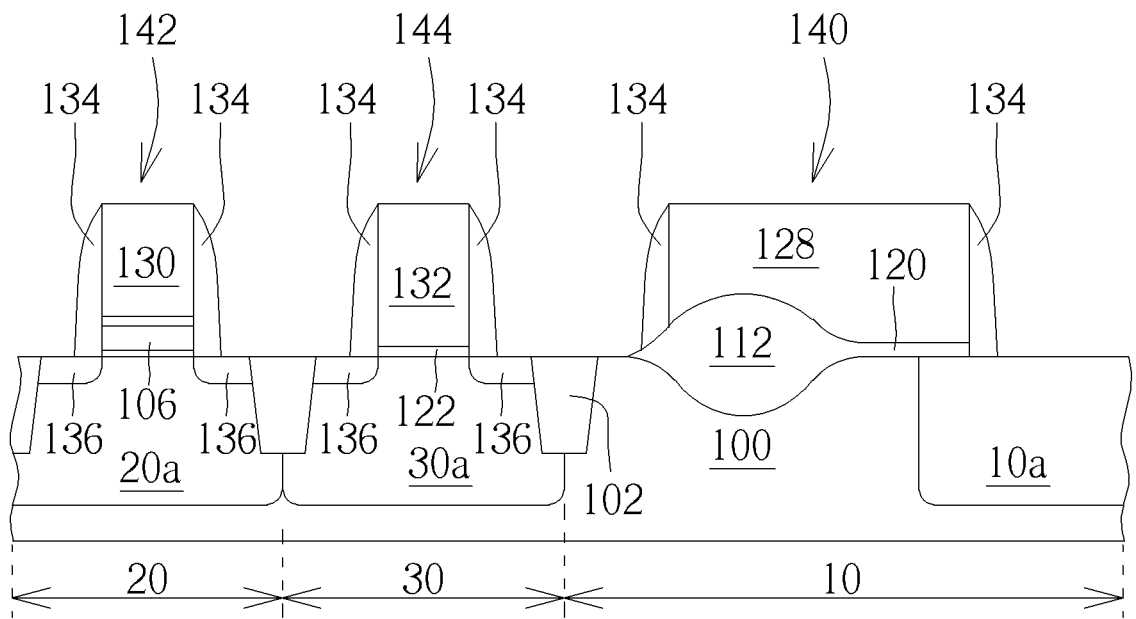

Next, please refer to FIG. 8. After the gate electrodes 128, 130 and 132 of each device are formed, spacers 134 and source/drain regions 136 for memory device and MOS device may be formed in each area. Source/drain regions 136 may be formed in the substrate 100 beside the gate electrodes 130 and 132 by implanting a fixed impurity with a mask layer formed by common lithography techniques. Spacers 134 may be formed on sidewalls of the gate electrodes 128, 130, 132 by first forming an insulation layer (not shown) over the whole surface of the substrate 100. The insulation layer is subjected to an anisotropic etching to form the sidewall insulation structures, i.e. spacers at the side of the gate electrodes. In this way, the DMOS device 140, SONOS memory device 142 and low-voltage CMOS device 144 are formed respectively on the first area 10, second area 20 and third area 30.

Please note that in the present invention, the source/drain regions 136 may include additional lightly-doped drain (LDD) regions to reduce hot-carrier effect over the conventional MOSFET, and the spacers 134 may be a multilayer structure in which a thinner L-shaped silicon nitride layer and the silicon oxide layer are deposited between the spacer and the gate electrode to provide stress enhancement and improve transistor performance. For the clarity of drawings and not obscuring the key point of the present invention, FIG. 8 only illustrates schematic simple spacer and source/drain structure.

The method for manufacturing a semiconductor device of the embodiment enables the high-voltage device, such as bipolar-CMOS-DMOS (BCD), which needs high temperature process to form a deep well and thick field oxide and gate dielectric layer as compared with the low-voltage MOS device and the SONOS-based memory device, which needs the specific process for forming the multilayer film, to be provided together. Specifically, in the present invention, the silicon nitride layer of ONO charge trapping tri-layer may serve as an etch mask in the formation of opening for field oxide. In addition, the thermal oxidation process for forming the field oxide may simultaneously form the top silicon oxide layer of ONO charge trapping tri-layer. As a result, manufacturing processes can be simplified.

According to the method of present invention provided above, a semiconductor device with relevant integrated memory devices and metal-oxide-semiconductor (MOS) devices is also provided in the present invention. The semiconductor device includes a substrate 100 with a first region 10a and a second region 20a, multiple double-diffused metal-oxide-semiconductor (DMOS) devices 140 on first area 10, wherein double-diffused metal-oxide-semiconductor (DMOS) device 140 includes a field oxide 112 on the substrate 100, a first gate dielectric layer 120 adjacent to the field oxide 112, and a first polysilicon gate 128 on the field oxide 112 and the first gate dielectric layer 120, and multiple memory units 142 on the second region 20, wherein the memory unit 142 includes an oxide-nitride-oxide (ONO) tri-layer 116 and a second polysilicon gate 130 on the oxide-nitride-oxide (ONO) tri-layer 116, wherein a top surface of the second polysilicon gate 130 of the memory unit 142 in the second region 20 and a top surface of the first polysilicon gate 128 of the double-diffused metal-oxide-semiconductor (DMOS) 140 in the first region 10 are on the same level.

The present invention is not limited to the above-mentioned embodiments. There may be many modifications, changes, and alterations without departing from the scope or spirit of the present invention. For example, while the SONOS type memory transistor is explained in the embodiment, the MONOS or MNOS type memory transistor also can be manufactured in the same manner. Thus, the multi-player film can be the multilayer film deposited by at least two layers of the silicon oxide layer and the silicon nitride layer. Also, while the LOCOS method is explained as the method for forming the field oxide in the embodiment, the semi-recessed LOCOS method or the recessed LOCOS method may also be used.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device with integrated memory devices and metal-oxide-semiconductor (MOS) devices, comprising:
 a substrate with a first area and a second area;
 multiple double-diffused metal-oxide-semiconductor (DMOS) devices on said first area, wherein said double-diffused metal-oxide-semiconductor (DMOS) device comprises a field oxide on said substrate, a first gate dielectric layer adjacent to said field oxide, and a first polysilicon gate on said field oxide and said first gate dielectric layer; and
 multiple memory units on said second area, wherein said memory unit comprises an oxide-nitride-oxide (ONO) tri-layer and a second polysilicon gate on said oxide-nitride-oxide (ONO) tri-layer, wherein a top surface of said second polysilicon gate of said memory unit in said second area and a top surface of said first polysilicon gate of said double-diffused metal-oxide-semiconductor (DMOS) in said first area are on the same level.

2. The semiconductor device with integrated memory devices and metal-oxide-semiconductor (MOS) devices of claim 1, further comprising multiple complementary metal-oxide-semiconductor (CMOS) devices in said first area, wherein said complementary metal-oxide-semiconductor (CMOS) device comprises a second gate dielectric layer and a third polysilicon gate on said second gate dielectric layer, and a top surface of said third polysilicon gate of said complementary metal-oxide-semiconductor (CMOS) is on the same level as said top surface of said first polysilicon gate of said double-diffused metal-oxide-semiconductor (DMOS) in said first area and said top surface of said second polysilicon gate of said memory unit in said second area.

3. The semiconductor device with integrated memory devices and metal-oxide-semiconductor (MOS) devices of claim 2, wherein said first gate dielectric layers of said DMOS device is thicker than said second gate dielectric layers of said CMOS device.

4. The semiconductor device with integrated memory devices and metal-oxide-semiconductor (MOS) devices of claim 1, wherein said first polysilicon gate of said double-diffused metal-oxide-semiconductor (DMOS) partly overlaps said field oxide at one sides.

5. The semiconductor device with integrated memory devices and metal-oxide-semiconductor (MOS) devices of claim 1, wherein said memory unit is silicon-oxide-nitride-oxide-silicon (SONOS) memory.

* * * * *